United States Patent [19]

Koch

[11] 3,898,575

[45] Aug. 5, 1975

[54] SWITCH ARRANGEMENT FOR $V_{BE}$ COMPENSATION OF PUSH-PULL AMPLIFIERS

[75] Inventor: Hanspeter Koch, Wohlen AG, Switzerland

[73] Assignee: Patelhold Patentverwertungs- & Elektro-Holding A.G., Glarus, Switzerland

[22] Filed: Jan. 21, 1974

[21] Appl. No.: 435,273

[30] Foreign Application Priority Data

Jan. 24, 1973 Switzerland .......................... 916/73

[52] U.S. Cl. ....................... 330/15; 330/22; 330/28

[51] Int. Cl. ............................................ H03f 3/26

[58] Field of Search ........................... 330/15, 22, 28

[56] References Cited

UNITED STATES PATENTS 3,531,728 9/1970 Visher ................................. 330/15

*Primary Examiner*—R. V. Rolinec
*Assistant Examiner*—Lawrence J. Dahl
*Attorney, Agent, or Firm*—Orville N. Greene; Frank L. Durr

[57] ABSTRACT

Improvement in intermodulation damping and voltage compensation of the switching transistors in a class AB push-pull amplifier is obtained through the use of a compensation transistor whose collector and emitter electrodes are coupled across the poles of the amplifier d.c. source through respective collector and emitter resistors and whose base electrode is coupled to the secondary winding centertap of the input transformer.

A zener diode is coupled between base and collector electrodes of the compensation transistor to render current from the d.c. source flowing through the collector resistance substantially constant and independent of temperature.

The output transistors and the base electrode of the compensation transistor are all coupled to a common capacitor for thermal coupling purposes.

5 Claims, 4 Drawing Figures

SWITCH ARRANGEMENT FOR $V_{BE}$ COMPENSATION OF PUSH-PULL AMPLIFIERS

The present invention relates to transistorized push-pull amplifiers and more particularly to a novel push-pull amplifier circuit employing a compensation transistor to yield significant improvement in intermodulation damping and temperature compensation.

BACKGROUND OF THE INVENTION

The present invention is concerned with a switch arrangement for $V_{BE}$ compensation in intermodulation damping of push-pull type amplifiers whereby the compensation voltage $V_K$ is produced between the opposite poles of the amplifier circuit feed voltage and the flow direction poled diode which is connected between the center tap of the drive transformer and one pole of the feed voltage connecting point of the output transistors.

By way of an example, this type of switch is shown in FIG. 1 and forms a part of the known prior art.

From the point of view of linearity, as such, the intermodulation damping, of type AB push-pull amplifiers, it is recognized that these characteristics depend essentially upon the ideal adaption of the $V_{BE}$ voltage across the base-emitter junction. In order to obtain optimal linearity in such amplifiers and in order to obtain minimal intermodulation distortion, the base-emitter voltage of the output transistors must be compensated as is indicated in FIG. 1. Experience has shown that, with this object in mind, the compensation voltage $V_K$ is so chosen that the switching current $I_{CR}$ (i.e. $I_{C1}$ respectively, $I_{C2}$ without alternating current scattering) typically lies in the range of a few milliamps to some 10 milliamps according to the type of switch and transistors employed.

The switching current is dependent upon the base-emitter voltage $V_{BE}$ and the semiconductor temperature $T_j$ such that:

$$I_C = I_C\ (V_{BE};\ T_j)$$

With most of the present day switches the voltage $V_K$ on a poled diode D, flow of current is as shown in FIG. 1. By means of the resistance R, the diode current and, as a result $V_K$ can be so arranged that the desired flux current $I_{CR}$ will flow. The scattering dependent part of $V_K$ would be acquired from the emitter current over the resistances R1 and R2 as is shown in FIG. 1. To even out a general frequency component, the center-tap F of the input drive transformer T1 is coupled to a capacitor C which in turn is tied to the mass of alternating current measure which is, in FIG. 1, the negative pole of the feed voltage source $V_B$.

T2 serves as the output transformer. For temperature compensation, diode O is connected to the same capacitor as the output transistors Q1 and Q2. In this way the diode D exhibits the same thermal behavior as the base-emitter diode junctions of the output transistors Q1 and Q2.

According to the observations of the present inventor, the compensation with a simple diode and with ambient room temperature in the range from plus 20°C to 70°C, relative intermodulation distortion provides sufficiently good results. However, at lower temperatures, especially in the range of from +10°C to −20°C and with small scattering, a significant reduction of the intermodulation interval occurs.

BRIEF DESCRIPTION OF THE INVENTION

The present invention is characterized by providing excellent linearity in type AB push-pull amplifiers over a wide range of temperature and, with this, provides a betterment of the $V_{BE}$ compensation as well as the intermodulation damping of the output stage. This is achieved in such amplifiers of the prior art by obtaining the function performed through the use of a compensation diode by means of the emitter-base junction of a strong negative direct current feedback compensation transistor which is substituted therefor and which has its emitter and collector electrodes respectively coupled to emitter and collector resistors which in turn are coupled to the corresponding poles of the feed voltage $V_B$.

BRIEF DESCRIPTION OF THE FIGURES AND OBJECTS

It is therefore a primary object of the present invention to provide for excellent temperature compensation and intermodulation damping of push-pull type amplifiers through the novel employment of a compensation transistor.

The above, as well as other objects of the present invention will become apparent after consideration of the detailed description of the invention and drawings in which.

DETAILED DESCRIPTION OF THE INVENTION

Figure 1:
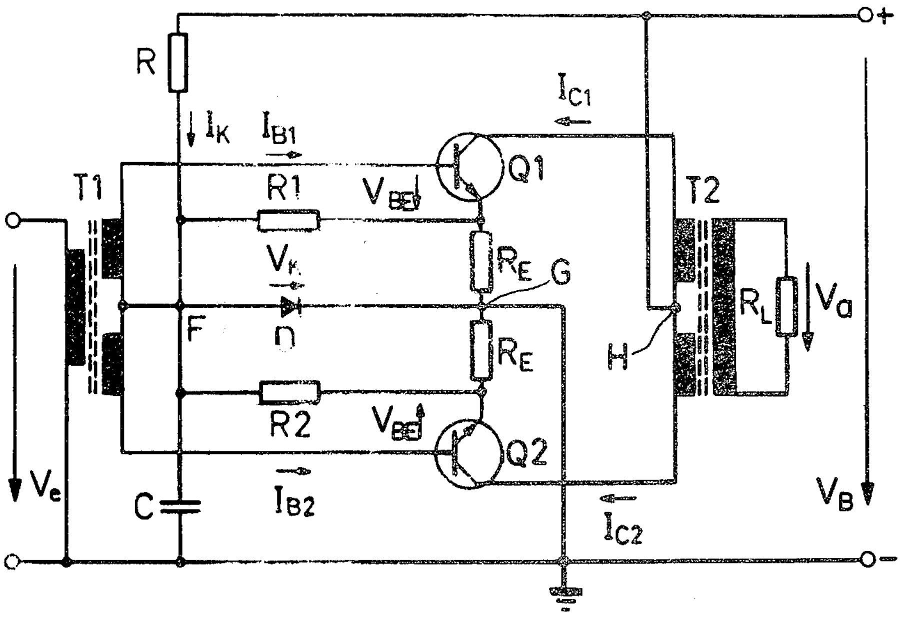
FIG. 1 PRIOR ART
FIG. 1 is a schematic diagram showing a push-pull amplifier employing a compensation diode.

FIG. 1 shows prior art push-pull amplifier of the class AB type utilizing a compensation diode D. The input signal $V_E$ is applied across the primary winding terminals of drive transformer T1 whose secondary winding has a center tap F coupled to the anode electrode of diode D and whose end terminals are respectively coupled to the base electrodes of transistors Q1 and Q2. The emitters of Q1 and Q2 are coupled through resistors $R_E$, $R_E$ to the negative pole of the feed voltage source $V_B$. The cathode of diode D is coupled to the center point G between resistors $R_E$, $R_E$. A series connected resistor R and capacitor C are coupled across the positive and negative poles of the feed voltage. The common terminal therebetween is coupled in common with the secondary winding center tap F. Resistors R1 and R2 are connected between the center tap terminal F and the emitter electrodes of Q1 and Q2, respectively. The collector electrodes of Q1 and Q2 are coupled to the end terminals of an output transformer T2 primary winding whose center tap H is coupled to the positive pole of the feed voltage. The secondary winding is coupled to a load resistor $R_L$ which develops the output voltage $V_A$.

Figure 2:
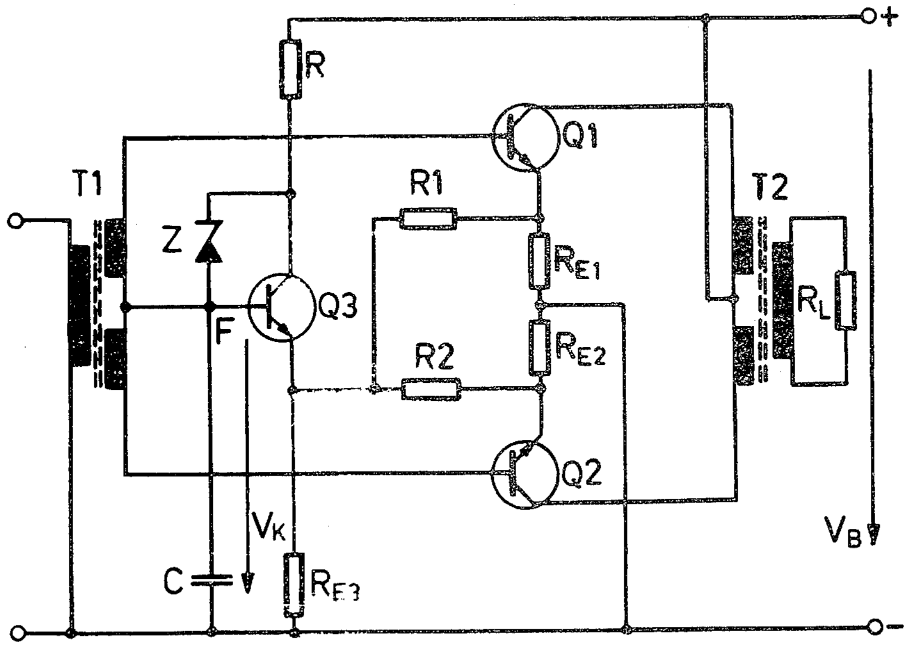
FIG. 2 is a schematic diagram showing a compensation switch design according to the present invention.

FIG. 2 shows the compensation switch of the present invention wherein like elements are between FIG. 1 and FIG. 2 are designated with like symbols. The arrangement of FIG. 2 differs from that of FIG. 1 through the employment of compensation transistor Q3 whose base-emitter junction performs the $V_{BE}$ compensation function of the diode D of FIG. 1 by thermal coupling. Transistors Q3 is analogous to diode D of FIG. 1 and is coupled to the same capacitor C as the output transistors Q1 and Q2.

Figure 3:
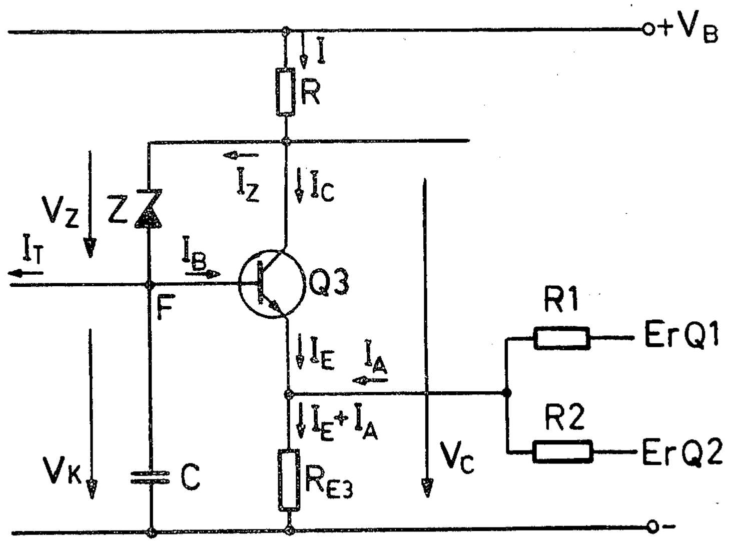
FIG. 3 is a schematic diagram showing a portion of the switch design of FIG. 2 with the currents and voltages of the various circuit paths also being depicted to facilitate an understanding of the invention.
Figure 4:
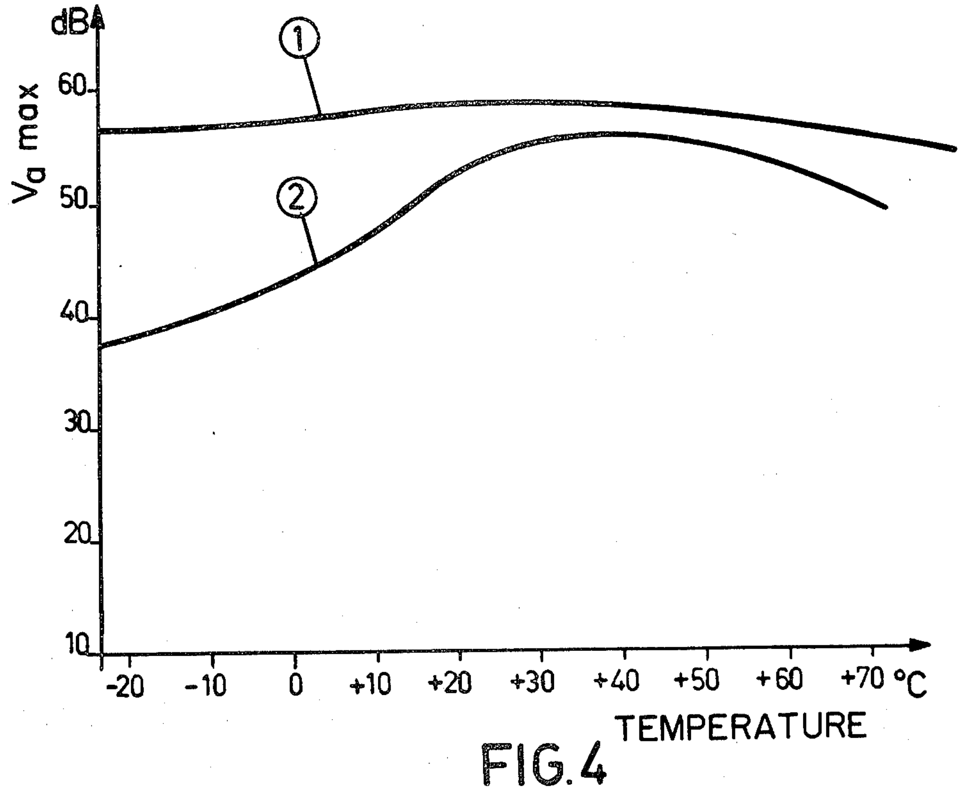
FIG. 4 shows a plot of curve useful in illustrating the comparative linearization between the prior art circuit and the improved design of the present invention.

The manner of operation of the present invention can best be understood from a consideration of the accompanying FIGS. 3 and 4. A significant improvement of the temperature control is consequently attributed to the fact that the compensation voltage $V_K$ is dependent essentially upon the Q3 collector current $I_C$. The average uniform choice of value of resistor R and the zener diode Z is established so that $I_C$ is approximately equal to $I_{CR}$ ($I_{CR}$ being the flux current of the output transistors Q1, Q2). Through the strong negative direct current feedback provided by zener diode Z, the current flow I is rendered essentially independent of temperature and is maintained constant through the collector resistance R of transistor Q3.

For $V_B$ = constant and R >> $R_3$ we have:

$V_B - V_C = IR \approx$ constant.

The validity of this relationship has been found to increase as the difference $V_B - V_C$ increases in relation to the temperature condition changes $\Delta V_C$ which is:

$\Delta V_C = \Delta V_K(T) + \Delta V_Z(T)$

To maintain equilibrium, the relationship:

$\alpha V_C = - \Delta IR$ must hold true.

Through judicious selection of large values for $V_B$, $R$, $V_Z$ and $R_{E3}$ (the emitter resistance of transistor Q3), it is possible to assure that:

$$\Delta I << I.$$

The compensation voltage $V_K$ is always dependent upon temperature so that $$I \approx \text{constant}$$

remains true. As such, a very exact conformity of $V_K$ to the temperature behavior of the output transistors Q1 and Q2 is obtained.

As in the case of experience with the present day compensators, a scattering dependent component $V_K$ is necessary. This is obtained in the present invention by virtue of the emitter voltage of the output transistors Q1 and Q2 over R1 and R2 through $I_A \cdot R_{E3}$ ($E_r$Q1 and $E_r$Q2 constituting the conductors coupled to the respective emitters of Q1 and Q2).

The diagram of FIG. 4 shows the intermodulation interval of the third order of distortion by comparison between the traditional simple diode compensation technique (curve 2) and the vastly improved compensation obtained through the use of transistor Q3 (curve 1). The ordinant is is given in tens of the single signal of $5 \cdot 10^{-2} \cdot V_a$ max except at intermodulation intervals. The abscissa is given in °C. Intermodulation intervals were measured by Zweiton tests of 5% scattering at $f1 = 350$ kHz and $f2 = 353$ kHz. On the diagram the intermodulation interval third order ($f = 356$ kHz) accepted at a 5% signal, is also shown.

Therefore:

$V_a\ 100\% = \sqrt{P \cdot R_L}$:

$P = 25$ watts $R_1 = 50\ \Omega$ and it is demonstrated that, according to the invention, the compensation of the intermodulation scattering is practically independent of temperature (curve 1). On the other hand, employing the traditional diode compensation teachnique, it can be seen that a noticeable deterioration is observed beneath plus 10°C. Furthermore, it has been observed that the transistor Q3 need not be matched with transistor Q1 and Q2 and in fact that the less the matching of these transistors, the greater is the effectiveness of the compensation principle.

Although there has been described a preferred embodiment of this novel invention, many variations and modifications will now be apparent to those skilled in the art. Therefore, this invention is to be limited, not by the specific disclosure herein, but only by the appending claims.

I claim:

1. In a push-pull amplifier comprised of a drive transformer, an output transformer, and first and second transistors, the input winding of the drive transformer receiving the signal to be amplified, the output winding of the drive transformer having its opposite terminals coupled to the base electrodes of the first and second transistors respectively and having a center tap, a feed voltage source having one of its poles coupled to the center tap through a capacitor, the emitters of said first and second transistors each being coupled through respective first and second resistances to said one pole of the feed voltage and the collectors of said first and second transistors being coupled to the opposite terminals of the output transformer primary winding whose center tap is coupled to the remaining pole of the feed voltage and whose secondary winding is coupled to the load means, the improvement comprising:

a compensation transistor whose base and emitter electrodes are respectively coupled to the drive transformer secondary winding center tap and a common terminal, the emitters of said first and second transistors each being connected to said common terminal, the emitter and collector electrodes of said third transistor being respectively coupled to the opposite poles of the feed voltage through collector and emitter resistors.

2. The apparatus of claim 1 further comprising a Zener diode coupled between the collector and base electrodes of said third transistor to provide a strong negative direct current feedback therebetween.

3. The apparatus of claim 2 wherein the value of the collector resistance and the Zener diode are selected to make the collector current of said third transistor substantially equal to the collector current of the first and second transistors when said first and second transistors are conducting.

4. The apparatus of claim 1 wherein the base electrode of the third transistor is coupled to said capacitor to provide good thermal coupling.

5. The apparatus of claim 1 wherein third and fourth resistances have their first end terminals respectively coupled to the emitter electrodes of said first and second transistors and have their opposite end terminals connected to said common terminal.

* * * * *